United States Patent [19]

Izumi

[11] 4,340,847
[45] Jul. 20, 1982

[54] APPARATUS FOR SUPERVISING AND CONTROLLING THE OUTPUT POWER OF INDUCTION MOTORS

[75] Inventor: Kaichi Izumi, Tokyo, Japan
[73] Assignee: Kao Soap Company Limited, Tokyo, Japan
[21] Appl. No.: 180,634
[22] Filed: Aug. 25, 1980

[30] Foreign Application Priority Data

Sep. 7, 1979 [JP] Japan ............................... 54/115007

[51] Int. Cl.³ .......................................... H02K 11/00
[52] U.S. Cl. .................................. 318/490; 73/862.09; 324/158 MG; 340/648
[58] Field of Search ................ 318/490; 324/163, 166, 324/78 J, 158 MG; 73/862.09; 340/648

[56] References Cited

U.S. PATENT DOCUMENTS

| | | | |
|---|---|---|---|
| 2,887,654 | 5/1959 | Strassman | 324/166 |
| 2,938,166 | 5/1960 | Hirsh | 324/166 |
| 3,573,619 | 4/1971 | Ivec | 324/78 J |
| 4,063,112 | 12/1977 | Dumbeck | 318/490 |
| 4,091,662 | 5/1978 | Emanuel | 324/158 G |
| 4,141,244 | 2/1979 | Dumbeck | 318/490 |
| 4,194,129 | 3/1980 | Dumbeck | 318/490 |

Primary Examiner—David Smith, Jr.
Attorney, Agent, or Firm—Philip M. Hinderstein

[57] ABSTRACT

An apparatus for supervising and/or controlling the output power of an induction motor comprising means for generating a first voltage signal (Ha) which varies with the actual speed of the motor, means for generating a second voltage signal (S) corresponding to the synchronous speed of the motor, means for generating a third voltage signal (H) proportional to the speed of the motor at the rated maximum output, circuit means for generating voltage signals proportional to either S-H or S-Ha, a first meter responsive to the signal proportional to S-Ha for indicating the output power of the motor, a first voltage divider circuit coupled between the output of the circuit means for generating voltage signals proportional to S-H or S-Ha and the first meter to change the scale of the first meter, a second voltage divider circuit coupled to the output of the first voltage signal generating means and responsive to the frequency of the voltage source for the induction motor for producing an output voltage indicative of the actual speed of the motor in operation irrespective of the frequency of the voltage source, and a second meter responsive to the output voltage of the second voltage divider circuit.

11 Claims, 8 Drawing Figures

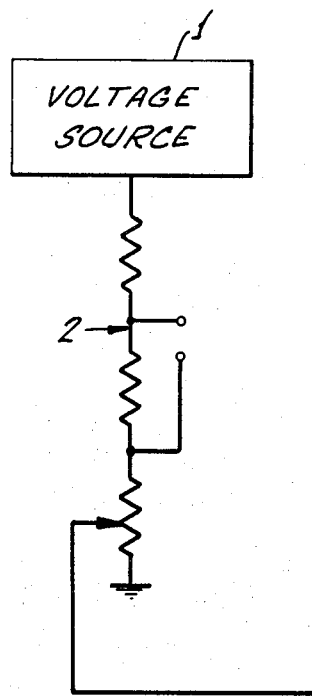
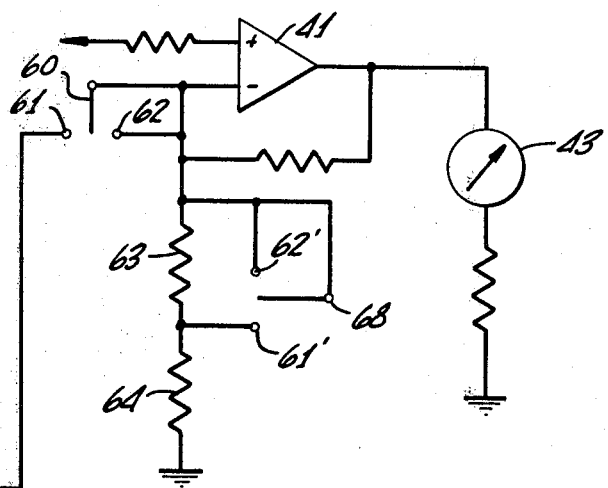
Fig. 5.
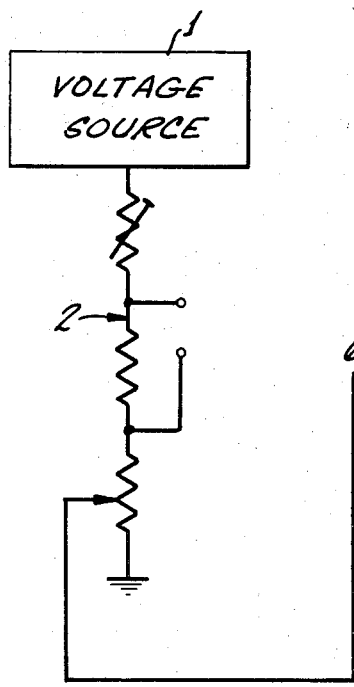
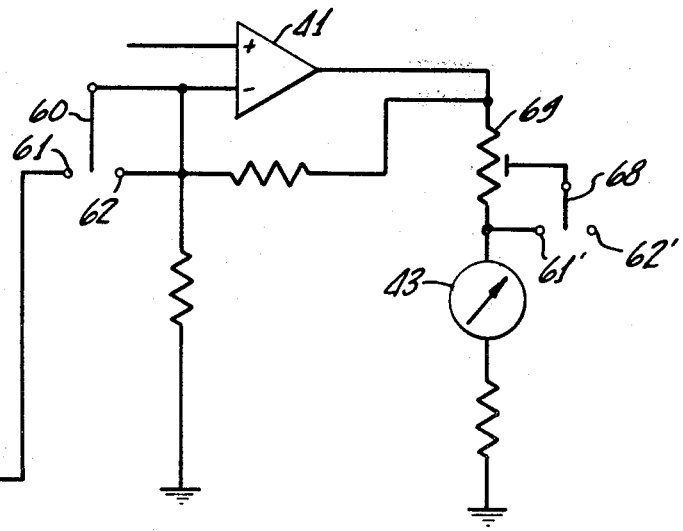
Fig. 6.

APPARATUS FOR SUPERVISING AND CONTROLLING THE OUTPUT POWER OF INDUCTION MOTORS

BACKGROUND OF THE INVENTION

1. Field of the Invention

The present invention relates to apparatus for supervising and controlling the output power of induction motors and, more particularly, to circuit means which is capable of checking the loading conditions of an induction motor to a higher precision in a range exceeding the rated maximum load and which is capable of indicating rotary speed in terms of a percentage of synchronous speed.

2. Description of the Prior Art

In an induction motor, as the load and the output torque increase, the rotary speed decreases and simultaneously the electric current consumption increases. It is therefore possible to supervise the loading conditions of an induction motor by measuring and supervising the rotary speed. However, since the change in the rotary speed with respect to the load variation is small, it is difficult to satisfactorily supervise changes in the rotary speed by use of a conventional tachometer.

Synchronous speed (S) is calculated from the line frequency (f) and the number of poles of a motor (P) by the following equation, which is independent of the output capacity:

$$S = (120\ f)/(P). \qquad (1)$$

The slip (S1) of an induction motor is proportional to the difference between the synchronous speed and the actual speed as follows:

$$S1 = (S - Ha)/(S) \times 100\% \text{ and} \qquad (2)$$

$$S1\max = (S - H)/(S) \times 100\%, \qquad (3)$$

where Ha = the actual motor speed in operation and H = the speed at the rated maximum output.

For most induction motors, slip at rated maximum ranges from 0.3 to 5%. Due to the very small value of slip, only a very narrow portion of the scale of a tachometer is useful as an effective reading range and precision of the scale reading is very poor. For example, if one is to determine the output of a 4-pole motor, the maximum slip of which is 5% and which is operated at a line frequency of 50 Hz, the rotary speed of the motor varies from 1500 to 1425 rpm as the load changes from 0–100% of the rated maximum. Assuming that the tachometer has a scale of 0 to 1500 rpm divided by 100, misreading of one division causes only a 1% error when it is used as a tachometer but when the tachometer is used as an output meter, the same misreading causes a 20% error.

An apparatus is also known for supervising the loading conditions by supervising the electric current consumption. This, too, is not satisfactory as the change in the electric current consumption with respect to the change in load is too small.

Induction motors are also used in applications where load variations are greater than usual, such as motors for agitating devices or for machine tools. In monitoring the load of an induction motor involving a load greater than the rated maximum, no sufficient supervision was heretofore possible by simply checking the rotary speed or the electric current consumption.

In my copending U.S. patent application Ser. No. 59,261, filed July 20, 1979, entitled APPARATUS FOR THE MEASUREMENT OF THE MECHANICAL OUTPUT OF INDUCTION MOTORS now U.S. Pat. No. 4,281,288, there is disclosed circuit means for providing a quick and easy measurement of the output power of an induction motor. The apparatus comprises means for generating a first voltage signal (S) proportional to the synchronous speed of the motor, means for generating a second voltage signal (Ha) proportional to the actual speed of the motor in operation, means for generating a third voltage signal (H) proportional to the speed of the motor at the rated maximum output, and means for generating a voltage signal proportional to $S - Ha$ and indicating such signal in terms of a percentage of the rated maximum. The signal proportional to $S - Ha$ is applied to a meter for providing a continuous indication of the output power of the motor.

While the apparatus for my copending application is exceedingly effective for measuring the output of an induction motor while the motor is operating within the range of the rated maximum output, the output thereof under overload conditions can not be accurately measured. That is, for an accurate measurement of the output of an overloaded motor, it is necessary to suspend the measurement in order to readjust the established value of the slip and the full scale of the meter. For example, by setting a 6% slip for an induction motor having a maximum slip of 4%, measurement of the output under an overload of up to 150% becomes possible. It is also possible to measure the output under an overload of 125% or 200% by readjusting the calibration of the meter so as to point the full scale at 80% or 50% of the original full scale reading.

However, overloading conditions appear only for a very short period of time in the actual operation of an induction motor and it is not appropriate to measure the output under overload by the method described above. The apparatus of my prior application is inconvenient in that the meter is incapable of directly indicating the speed of rotation and is constructed to merely indicate the output, from which the speed of rotation at the time of the output has to be calculated from an equation.

SUMMARY OF THE INVENTION

The present invention has been conceived to improve upon the above mentioned defects and it is the aim of the present invention to provide an apparatus for supervising and controlling the output of induction motors which is capable of checking the loading conditions at a higher precision in a range exceeding the rated maximum load of a motor and which is capable of indicating rotary speed in terms of a percentage of the synchronous speed.

Briefly, the present apparatus for supervising and/or controlling the output power of an induction motor comprises means for generating a first voltage signal (Ha) which varies with the actual speed of the motor, means for generating a second voltage signal (S) corresponding to the synchronous speed of the motor, means for generating a third voltage signal (H) proportional to the speed of the motor at the rated maximum output, circuit means for generating voltage signals proportional to either $S - H$ or $S - Ha$, a first meter responsive to the signal proportional to $S - Ha$ for indicating the output power of the motor, a first voltage divider circuit coupled between the output of the circuit means for generating voltage signals proportional to S—H or S—Ha and the first meter to change the scale of the first meter, a second voltage divider circuit coupled to the output of the first voltage signal generating means and responsive to the frequency of the voltage source for the induction motor for producing an output voltage indicative of the actual speed of the motor in operation irrespective of the frequency of the voltage source, and a second meter responsive to the output voltage of the second voltage divider circuit.

The invention is characterized in that a switching control means is provided for controlling the switching of the first voltage divider circuit by the voltage obtained in the second voltage divider circuit. A preferred embodiment of the present invention uses a meter-relay as the second meter in order to utilize the contact thereof for switching control means. It is also preferable that the switching control means shall include a third voltage divider circuit to divide the output of the second voltage divider circuit, zener diodes, each having a different zener voltage, connected to respective dividing points of the circuit, the zener diodes being connected to the bases of transistors, and relays connected to the collectors of the transistors.

It is further preferable to construct the present apparatus using a single meter which functions as both the first and second meters by switching the indications by means of a switch. It is still preferable to provide a differential amplifier positioned in the input circuit of the second meter, a circuit which supplies a DC voltage of a constant value to one of the inputs of the amplifier, and a circuit which makes the sensitivity of the second meter variable. Protective diodes are preferably inserted in series with the output of the differential amplifier. It is also preferred that diodes for full-scale protection be inserted in parallel with the meter. It is also preferable that the electric potential at the contact of the meter relay or the meter should be lead to an outside terminal. It is further preferred that at least one of the analog signals which are inputs into the first or second meters should be lead to an outside terminal.

OBJECTS, FEATURES AND ADVANTAGES

It is therefore an object of the present invention to solve the problems associated with conventional devices for supervising and controlling the output of induction motors. It is a feature of the present invention to solve these problems by providing an apparatus which is capable of checking the loading conditions at a higher precision in a range exceeding the rated maximum load of a motor and which is capable of indicating the rotary speed in terms of a percentage of the synchronous speed. An advantage to be derived is that the output of an induction motor under overload conditions can be accurately measured. A further advantage is that the actual speed of a motor in operation can be indicated irrespective of the frequency of the voltage source for the motor.

Still other objects, features and attendant advantages of the present invention will become apparent to those skilled in the art from a reading of the following detailed description of the preferred embodiment constructed in accordance therewith, taken in conjunction with the accompanying drawings wherein:

BRIEF DESCRIPTION OF THE DRAWINGS

FIG. 5 is a circuit diagram of a fourth embodiment of the present invention;

FIG. 6 is a circuit diagram of a fifth embodiment of the present invention;

DESCRIPTION OF THE PREFERRED EMBODIMENTS

Figure 1:
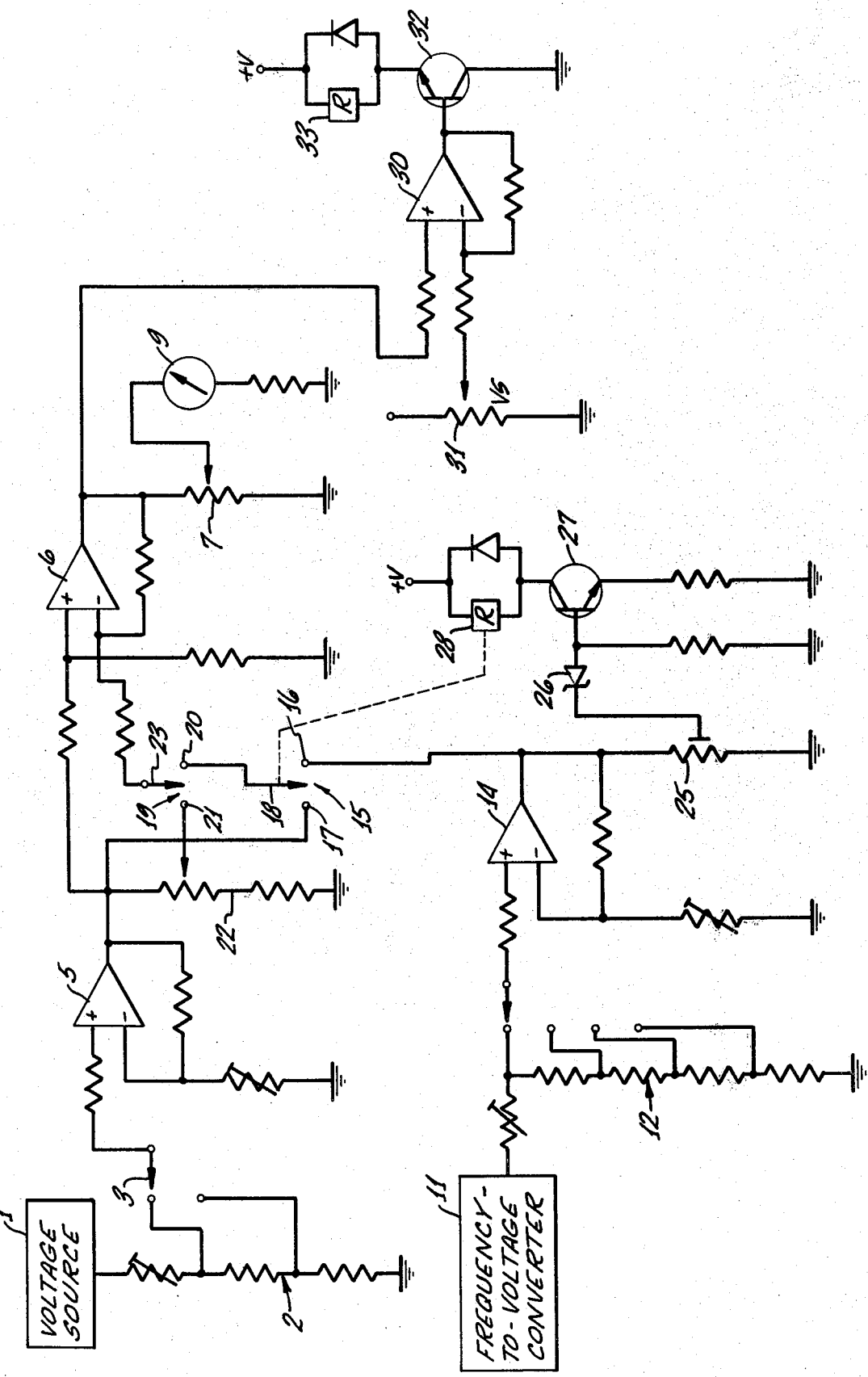
FIG. 1 is a circuit diagram of the important circuit components of the invention of my beforementioned copending U.S. patent application.

Referring now to FIG. 1, the reference numeral 1 denotes a voltage source for generating a reference voltage. Since the synchronous speed and the maximum rated speed of an induction motor are generally constant, it is possible to generate voltages corresponding thereto from voltage source 1. The output of reference voltage source 1 is connected to a resistance type voltage divider circuit 2 which divides the output voltage by a voltage corresponding to the frequency of the electric source for the induction motor, as will be explained more fully hereinafter. The divided voltage from circuit 2 is connected via a switch 3 to the noninverting input of a differential amplifier 5, which functions as a buffer circuit. The output of amplifier 5 is connected to the noninverting input of a differential amplifier 6, the output of which is connected to a meter 9 via a potentiometer 7. A rotary frequency-to-voltage converter 11 which is mechanically connected to the induction motor under supervision (not shown) generates a DC voltage corresponding to the rotary speed of the motor. The output of converter 11 is connected to one of the inputs of an amplifier 14 via a resistance type voltage divider circuit 12 which functions to maintain the input voltage of amplifier 14 at a constant level irrespective of the number of the poles of the induction motor, provided that the ratio of the rotary speed to the synchronous speed is constant. The output of amplifier 14 is connected to a switching contact 16 of a switch 15, the other contact 17 of switch 15 being connected to the output of amplifier 5. A common contact 18 of switch 15 is connected to a switch contact 20 of another switch 19. The other switch contact 21 of switch 19 is connected to a resistance type voltage divider circuit 22 connected to the output of amplifier 5. A common contact 23 of switch 19 is connected to the inverting input of differential amplifier 6. Voltage divider circuit 22 is provided to permit making a full scale adjustment of the output indication on meter 9 and is constructed to establish the slip (referred to as "Maximum slip" herein) from which the rated maximum output is obtained and to supply switch contact 21 with a voltage corresponding to the speed at the rated maximum output.

The output of amplifier 14 is connected to the base of a transistor 27 by means of a variable resistor 25 and a zener diode 26. The collector of transistor 27 is connected to the coil of a relay 28. Relay 28 is connected to the common contact 18 of switch 15 so that switch 15 will not be connected to switch contact 16 unless relay 28 is energized, thereby preventing damage of meter 9.

The output from differential amplifier 6 is conducted to the input of a comparator amplifier 30. A set voltage Vs from a resistance type voltage divider circuit 31 is applied to the other input of amplifier 30. The output of amplifier 30 is conducted to the base of a transistor 32, the collector of which is connected in series with the coil of a relay 33.

With such a construction, the two inputs of differential amplifier 6 are supplied with the output voltage from amplifier 14 and a voltage corresponding to the synchronous speed from amplifier 5 so that the difference between the two voltages is produced at the output of amplifier 6. In order for this difference signal to be indicated by meter 9, switch 19 is switched to contact 21 to establish a maximum slip which can be calculated from the rated maximum output indicated on the induction motor to be measured. The potentiometer 7 is adjusted to set the maximum slip to be indicated as the full scale reading of meter 9. Switch 19 is then switched to contact 20 while switch 15 is switched to contact 16. Meter 9 indicates zero when the induction motor is rotating at the synchronous speed, that is, when the load is zero, and when the rated load is imposed, the meter reads full scale.

The output of differential amplifier 6 is also supplied to amplifier 30. When the output of differential amplifier 6 is higher than the set voltage Vs, relay 33 will be energized whereas when it is lower, the relay will not be energized. Therefore, by utilizing the contact point (not shown) of relay 33, an alarm or a control signal can be generated when the load exceeds a certain set value.

While the construction just described may be exceedingly effective for measuring the output of an induction motor operating within the range of the rated output, the output thereof under overload conditions can not be accurately measured. That is, for an accurate measurement of the output of an over-loaded motor, it is necessary to suspend the measurement in order to readjust the established value of the slip and the full scale of the meter. However, overloading conditions appear only for a very short period of time in the actual operation of an induction motor and it is not appropriate to measure the output under overload by the method described above. The apparatus just described is inconvenient in that meter 9 is incapable of directly indicating the speed of rotation and is constructed to merely indicate the output in terms of a percentage of the rated maximum output from which the speed of rotation at the time of the output has to be calculated according to an equation.

Figure 2:
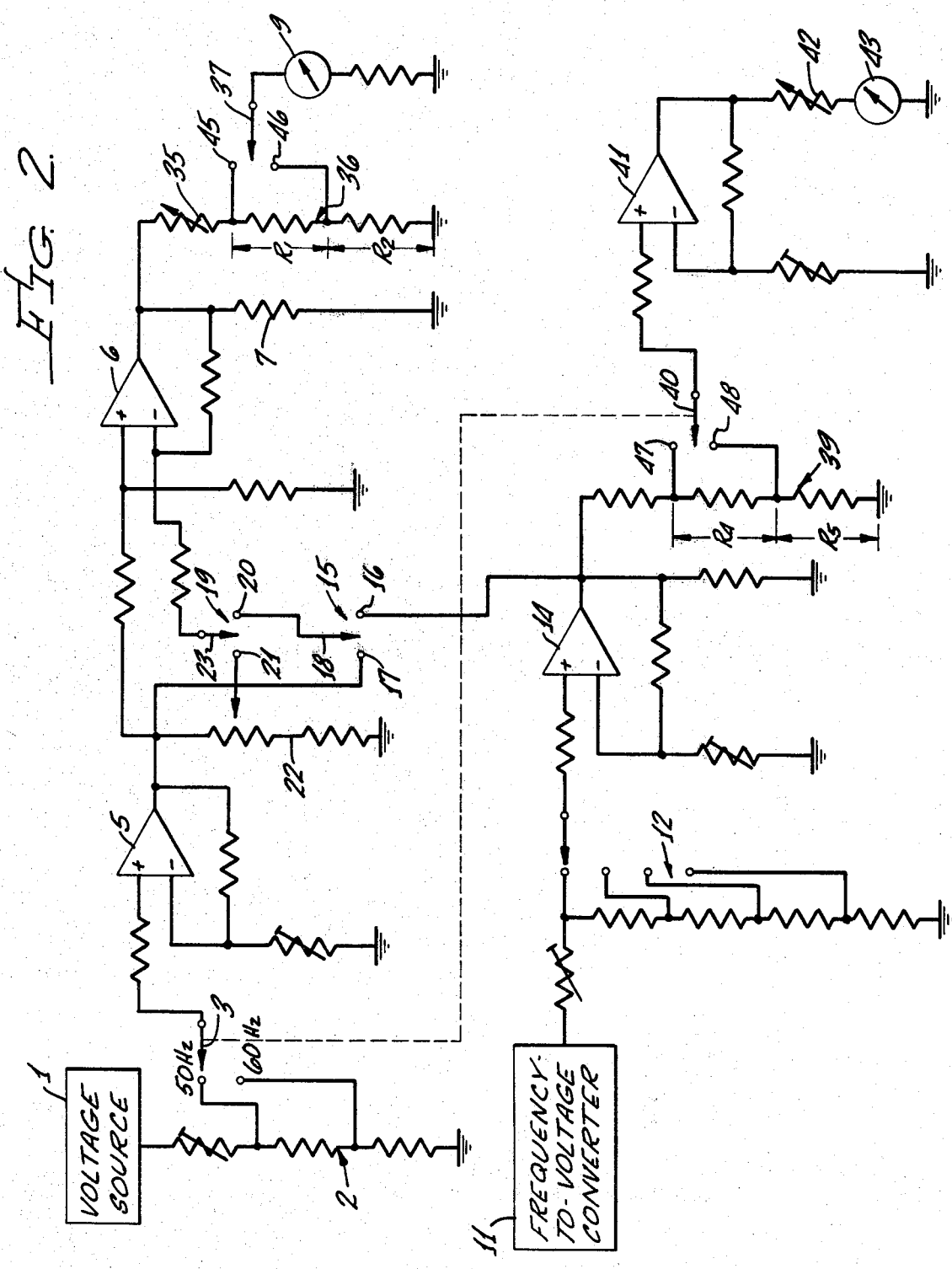
FIG. 2 is a circuit diagram showing the important parts of a preferred embodiment of the present invention.

Referring now to FIG. 2, there is shown the important parts of a preferred embodiment of the present invention. In the embodiment of FIG. 2, corresponding parts have been given the same numbers as used in FIG. 1. When compared with the conventional apparatus described in FIG. 1, the apparatus of FIG. 2 is characterized in that the output of differential amplifier 6 is connected to a variable resistor 35 and then to a resistance type voltage divider circuit 36 including a pair of resistors having the values $R_1$ and $R_2$ connected in series with resistor 35. Meter 9 is connected to voltage divider circuit 36 by means of a switch 37 which is alternately connectable to terminals 45 or 46 connected to circuit 36. The apparatus of FIG. 2 is also characterized in that the output from amplifier 14 is connected to a resistance type voltage divider circuit 39, including a pair of resistors having the values $R_4$ and $R_5$ connected in series and having a pair of output terminals 47 and 48 which are connected to one of the inputs of an amplifier 41 by means of a switch 40 which is connected to switch 3. The output of amplifier 41 is connected by means of a variable resistor 42 to a meter 43 which indicates the speed of rotation of an induction motor.

Meter 9 operates in the following manner to give an indication of the output power of the induction motor. Switch 37 is connected to tap 45 and a similar circuit operation as described with respect to FIG. 1 results so as to make meter 9 read full scale when the induction motor is under rated maximum load. The various adjustments enable an indication as described previously so long as the load is within the range of the rated load. On the other hand, the apparatus of FIG. 2 is conveniently characterized in that a precise indication may be possible even under overloading conditions. This is achieved as switch 37 is switched over to tap 46 when meter 9 approaches full scale. The switching operation expands the range of indication of meter 9, enabling an accurate indication of the output even under overloading conditions.

In this case, because of the relationship between the resistance values $R_1$ and $R_2$ of the resistance type voltage divider circuit 36, the limit of overload which meter 9 can indicate is expressed by the equation:

$$(R_1+R_2)/(R_2) \qquad (4)$$

If the resistance value $R_1$ is a variable resistor, it will be possible to preset the limit of overload corresponding with the operational conditions of the induction motor.

The operation of the circuit in indicating the speed of rotation of the induction motor by means of meter 43 will now be described. Amplifier 14 produces a voltage proportional to the speed of rotation of the induction motor corresponding with the frequency of the electric source for the motor. When the frequency of the electric source is 60 Hz, the output voltage of amplifier 14 will be 1.2 times what it is when the frequency of the source is 50 Hz. The output voltage of amplifier 14 is conducted to circuit 39. The relationship between the resistance values $R_4$ and $R_5$ of circuit 39 is $$(R_4+R_5)/(R_5)=1.2 \qquad (5)$$

The voltage of tap 47 becomes 1.2 times more than the voltage at tap 48. Switch 40 will be connected to tap 47 when the frequency of the electric source is 50 Hz and to tap 48 when the frequency is 60 Hz so that a voltage is applied to the input of amplifier 41, which voltage corresponds to the speed of rotation of the induction motor irrespective of the frequency of the voltage source. Therefore, the output of amplifier 41 corresponds only to the speed of rotation and by adjusting the full scale of meter 43 to the synchronous speed, meter 43 will at all times indicate the speed of actual rotation with the synchronous speed as 100%, regardless of the number of poles of the induction motor to be measured or the frequency of the electric source. In order to adjust the full scale of meter 43, it is possible to connect a synchronous motor to converter 11 and to adjust the pointer of meter 43 to indicate full scale with the use of variable resistor 42 when the motor reaches steady state operation. Although meter 43 in this case is connected through amplifier 41, it is also possible to directly connect meter 43 to switch 40.

It should be noted that the protective circuit comprising transistor 27, relay 28 and the like shown in FIG. 1 have been omitted in FIG. 2.

By using a meter-relay which has two control contacts at high and low positions as meter 43 in FIG. 2, it is possible to construct a protective circuit for meter 9. In other words, the initial full scale reading of meter 9 can be adjusted by setting the maximum slip which imposes the rated maximum load at divider circuit 22. After changing over switch 37, the full scale of meter 9 can be set by the limit of the overload factor given by the relation between the resistance values $R_1$ and $R_2$ of divider circuit 36 as expressed in equation (4). Therefore, by setting the higher contact point of the meter-relay used as meter 43 at the position of $$100 - \text{maximum slip (\%)}$$

in order to utilize the contact point in place of switch 37, switching so as to indicate the output under overload conditions can be automatically achieved. It is also possible to prevent meter 9 from going off scale on the side higher than the preset overload factor by setting the lower contact of the meter-relay at the position of $$(100 - \text{maximum slip}) \times \text{overload factor (\%)}.$$

It is also possible to activate an alarm lamp during an indication of overload by connecting a contact of the meter-relay to an outside terminal to be connected to such an alarm lamp (not shown). Various other controls can be carried out, for example, the electric source for the induction motor can be shut off in case the overloaded operation continues longer than a predetermined length of time.

It is further possible to connect the input of the meter 43 to an outside terminal to operate an outside meter for indication purposes by utilizing analog signals applied to the outside terminal, to control an outside device, or to record the speed of rotation of the induction motor under operation.

Figure 3:
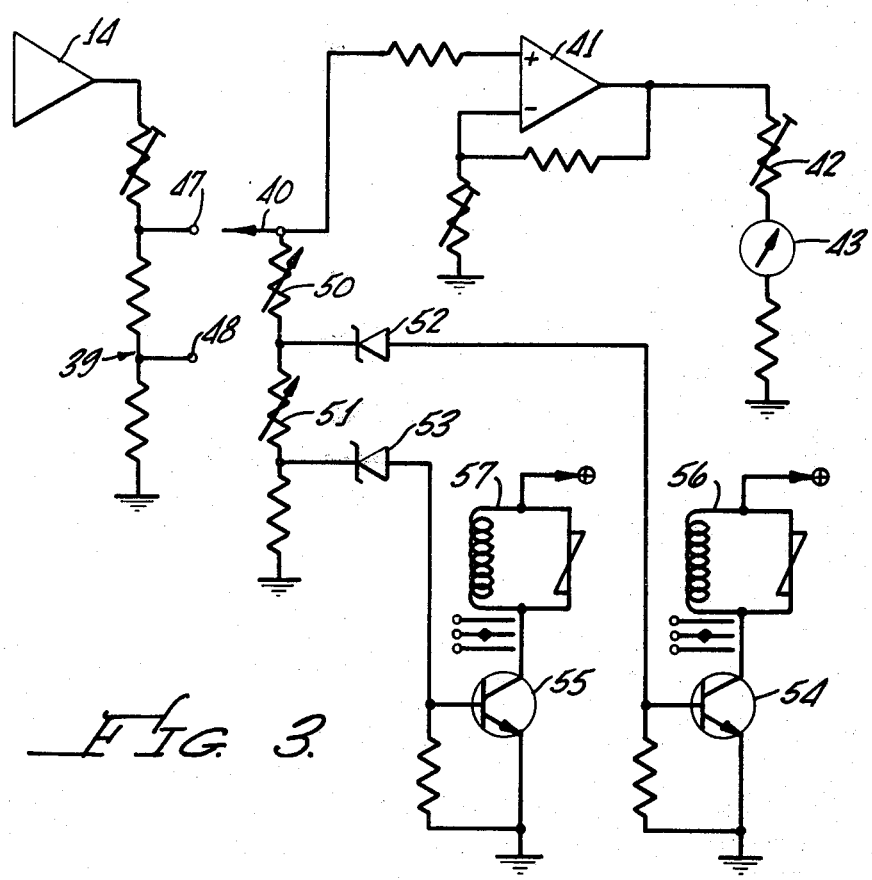
FIG. 3 is a circuit diagram of a second embodiment of the present invention.

Referring now to FIG. 3, there is shown a circuit diagram of a second embodiment of the present invention wherein the protective circuit of meter 9 includes a transistor. More specifically, the reference numerals 50 and 51 denote variable resistors to which zener diodes 52 and 53, respectively, of different zener voltages are connected. Zener diodes 52 and 53 are connected to the bases of transistors 54 and 55, respectively. Relays 56 and 57 are connected to the collectors of transistors 54 and 55, respectively. The other circuit components are the same as shown in FIG. 2.

In the circuit of FIG. 3, the use of zener diodes 52 and 53 having different zener voltages makes it possible to differentiate the operational points of relays 56 and 57. This achieves the same operation as that of a meter-relay having two different contact points as discussed in connection with FIG. 2. The free terminal of each relay is connected to an external terminal. By using relays 56 and 57 having a plurality of contacts, it is possible, by means of the movement of such relays, to carry out various control operations such as lighting an alarm lamp under overload conditions or activating a timer as soon as the motor begins operation under overload conditions so that the electric source for the motor can be shut off when the overload operation continues longer than a certain period of time.

Figure 4:
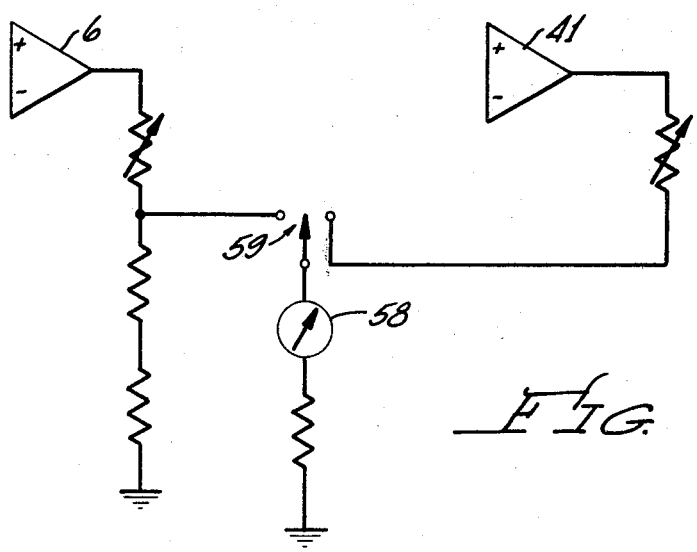
FIG. 4 is a circuit diagram of a third embodiment of the present invention.

Referring now to FIG. 4, there is shown a third embodiment of the present invention representing a further improvement in the protective circuit of FIG. 3. When compared to the circuit of FIG. 3, the circuit of FIG. 4 is characterized in that one of the contacts of relay 57 is used to control a switch 59 to alternately connect the outputs from differential amplifier 6 and amplifier 41 to a single meter 58. With such a construction, meter 58 is connected to the output of differential amplifier 6 for indicating the power output of an induction motor when the operation thereof is within the range of the rated maximum load and is connected to the output of amplifier 41 so as to indicate the speed of rotation of such motor when such motor is operating under overload conditions. Using a single meter 58 and switching it for indicating either speed of rotation or power output, the present apparatus can be made light, inexpensive and portable. It should be noted that the connection of the relay contacts is omitted in FIG. 4 as it is well known.

Referring now to FIG. 5, there is shown a circuit diagram of a fourth embodiment of the present invention which is constructed so as to accurately establish the operational point of a meter-relay when the apparatus is applied to a motor having a smaller than usual maximum slip. The embodiment of FIG. 5 is identical to that of FIG. 2 except as expressly noted. For example, the movable arm of a switch 60 is connected to the inverting input of amplifier 41. Voltage divider circuit 2 includes a movable tap which is connected to a switch contact 61 of switch 60 so as to apply 80-95% of the full scale voltage from reference voltage source 1 to terminal 61. Another switch contact 62 of switch 60 is connected in series with resistors 63 and 64. Resistors 63 and 64 are provided with taps 62' and 61', respectively, and a switch 68 is interconnected with switch 60 to select one of the taps 61' or 62'.

With such a circuit configuration, circuit operation is identical to that shown in FIG. 2 when switches 60 and 68 are connected to switch contact 62 and tap 62', respectively, and will operate in the same manner to indicate the speed of rotation with the synchronous speed as full scale. On the other hand, with switches 60 and 68 connected to switch contact 61 and tap 61', respectively, a voltage of 80-95% of the full scale of meter 43 is applied to the inverting input of amplifier 41 and, at the same time, resistor 63 is short-circuited. Amplifier 41 will, therefore, function as a differential amplifier and, what is more, will produce an amplified voltage equivalent to the range between 80 to 85% and 100% of the meter 43 indication. Meter 43 indicates the amplified voltage by magnifying the scale to calibrate between 0 and 100%.

Referring now to FIG. 6, there is shown a fifth embodiment of the present invention which is a modification of the embodiment of FIG. 5. When compared to the embodiment of FIG. 5, the embodiment of FIG. 6 is characterized in that meter 43 is connected in series with a resistor 69 having a movable tap connected to the arm of a switch 68 which is provided with taps 61' and 62'. Switches 60 and 68 are interlocked as described previously so that when switch 68 is connected to tap 61', part of resistor 69 is short-circuited to lower the resistance value, whereby the magnification of meter 43 decreases without changing the amplification factor of amplifier 41 so that meter 43 indicates the output of amplifier 41 by expanding the same to the scale 0 to 100%.

With the circuit constructions of FIGS. 5 and 6, the operational precision can be improved by 5 to 20 times if a meter-relay is used. This enables the control contact of such a meter-relay to be established accurately when the present invention is applied to a motor of constant speed characteristics having a lower maximum slip value. The switching of switches 60 and 68 may be carried out manually or by means of a timer which starts after a predetermined period of time after the induction motor is connected to the electric source therefore.

Figure 7:
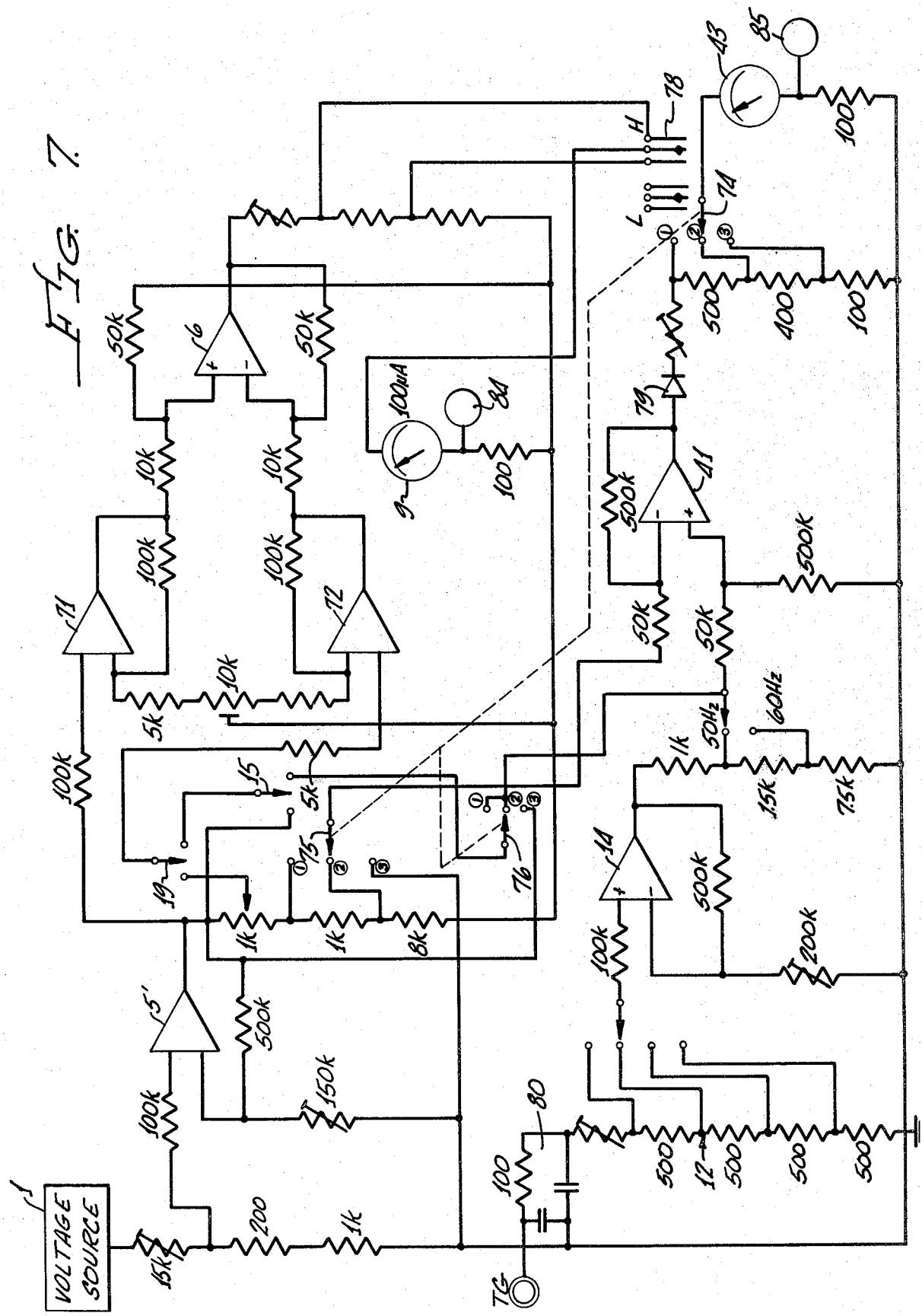
FIG. 7 is a circuit diagram of a sixth embodiment of the present invention.

Referring now to FIG. 7, there is shown a sixth embodiment of the present invention in which circuit values are given for all components so that the invention may be put into immediate practice. Differential amplifier 6 in the circuit of FIG. 7 is a circuit for calculating both speed and output power signals, as in the case of FIG. 2; however, there is provided three operational amplifiers 5', 71 and 72 as input stages thereof. Amplifier 5' corresponds to amplifier 5 of FIG. 2, but now the two operational amplifiers 71 and 72 are constructed as buffer circuits to improve the linearity of meter 9.

A switch 74 is provided for expanding the range of meter 43. Switches 75 and 76 are similarly provided and are interconnected with switch 74. The reference number 78 denotes a meter relay contact and the reference number 79 is a diode. The input signal in this case is supplied by a tacho-generator TG connected to the input of a smoothing circuit 80. Terminals 84 and 85 are connected to meters 9 and 43, respectively, to provide outputs for external devices from meters 9 and 43.

With the construction shown in FIG. 7, the electric source for the induction motor is switched on with switch 74 held at the position ① in the drawing. As the tacho-generator TG increases its speed, the indication on meter 43 for the speed of rotation increases. With switch 74 held at position ①, meter 43 gives an indication of 0 to 100% with the synchronous speed being 100%.

If switch 74 is changed to position ② when meter 43 reaches 80%, a voltage is applied to the inverting input of amplifier 41 by means of switch 75 so that the magnification of meter 43 will decrease and meter 43 is made to give an indication of 80-100% of the synchronous speed by expanding it to 0-100%. By setting the contact L of meter-relay 78 to correspond with an overload condition, meter 9 produces an output signal when the speed of rotation reaches a value corresponding to the overload factor. Contact L is used to control switch 15.

With the circuit values indicated in FIG. 7, meter 9 will operate on an induction motor having a maximum slip of 10% to indicate output signals up to 100% overload, provided the position of switch 74 is held at position ②. When switch 74 is moved to position ③, output signals up to 100% overload can be indicated by a meter 9 for a motor having a maximum slip of 5%. If the load exceeds such value, the indication of meter 9 will resume the position of 0.

Changing over of meter 9 for off scale prevention and overload indication is achieved by meter relay contact 78. The contact point H of meter relay 78 is used for protecting meter 9.

The polarity of the inputs of differential amplifiers 6, 41, 71 and 72 are opposite with respect to meters 9 and 43. It is noted, therefore, that meter 43 will never go off scale on the positive side but may go off scale on the negative side when the calibration is expanded. This is prevented by diode 79.

Figure 8:
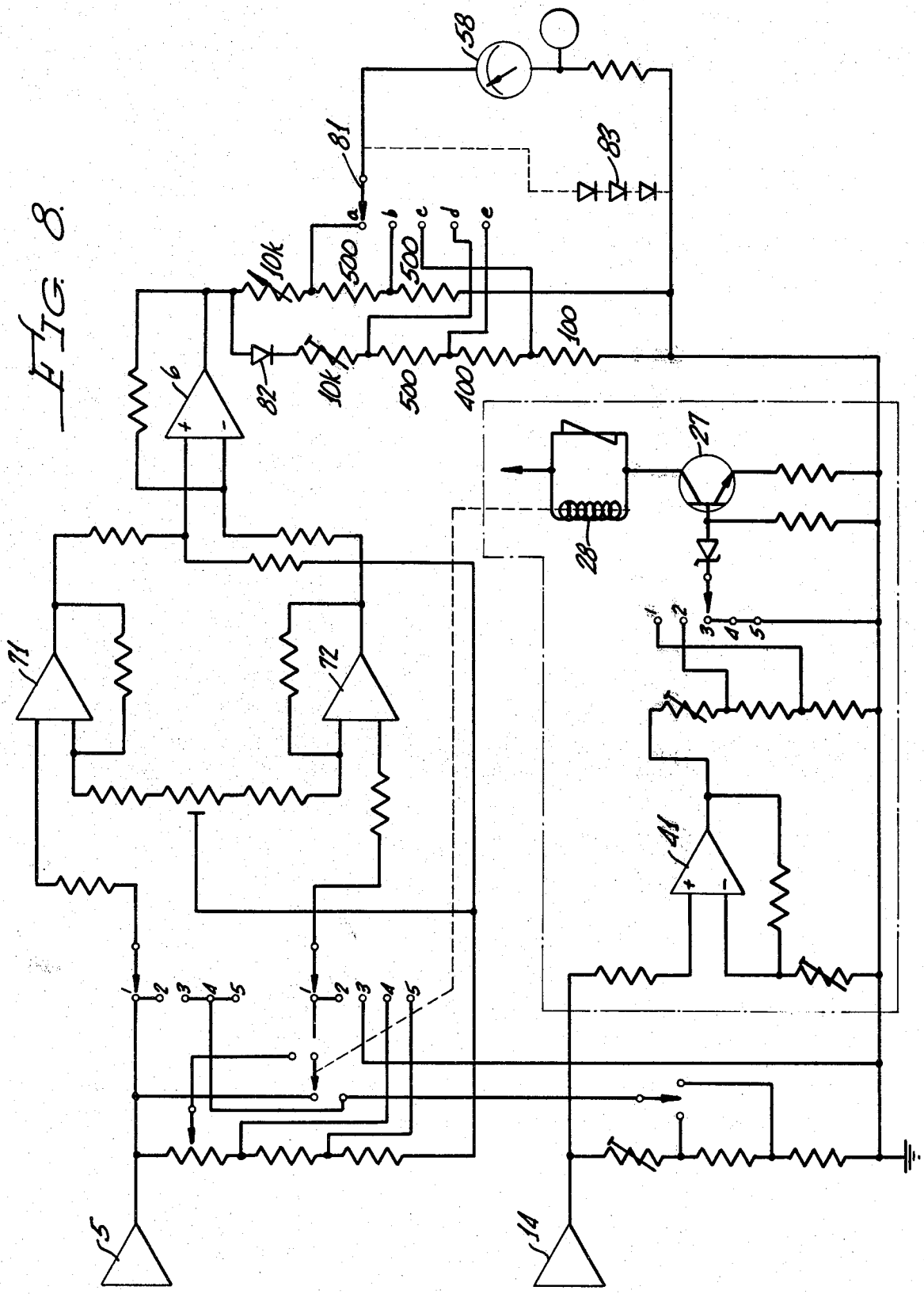
FIG. 8 is a circuit diagram of a seventh embodiment of the present invention.

Referring now to FIG. 8, there is shown a circuit diagram of a seventh embodiment of the present invention for the purpose of putting the circuit shown in FIG. 4 into actual implementation when the speed of rotation and the output power signals are indicated by a single meter. In the circuit of FIG. 8, an interlocking switch 81 is provided for transferring the various measuring functions to a meter 58, switch 81 being provided with switch contacts a through e. Switch contact a is for indicating the output in the range of 0 to 100% of the rated maximum, switch contact b is for indicating the output in the range of 0 to 200% of the rated maximum, switch contact c is for indicating the speed in the range of 0 to 100% of the synchronous speed, switch contact d is for providing a magnified indication of the speed in the range of 90 to 100% of the synchronous speed expanded to 0 to 100%, and switch contact e is for providing a magnified indication of the speed in the range of 80 to 100% of the synchronous speed expanded to 0 to 100%. When used as a tachometer meter, meter 58 is protected by diode 82 whereas when used as an output meter, it is protected by a circuit comprising transistor 27 and relay 28, as shown in FIG. 1. It is also possible to do the same by connecting diode 83 as illustrated by the broken line. In this case, the circuit encircled by a dot-and-dash becomes unnecessary.

As has been described above, it is possible, according to the present invention, to accurately indicate the power output of an induction motor even during periods of overload operation. It is also possible to indicate the rotary speed of the induction motor using the synchronous speed as the full scale value, without being affected by the frequency of the electric source for the motor or the number of poles thereof. It is still possible to simultaneously indicate the output of an induction motor as well as the speed of rotation which produces such output.

By utilizing a meter as a meter relay, various control operations can be carried out. If a circuit comprising a zener diode having different zener voltages and a transistor is used in place of the meter relay, other similar control operations can be provided.

Using change-over means to permit a single meter to perform multiple functions, the power output signal and the speed of rotation can be indicated by a single meter by switching the indications on the meter. The meter indication can be magnified by applying a predetermined amount of DC voltage to one of the inputs of the differential amplifiers provided in the input circuit of the meter and by either varying the gains of the differential amplifiers or varying the meter sensitivity. By inserting a protective diode into the output of the differential amplifier in a series arrangement, the meter will be prevented from going off scale on the negative side thereof. Similarly, by inserting a plurality of diodes for protection of the full scale reading of the meter in a parallel arrangement, going off scale on the positive side can be prevented.

While the invention has been described with respect to the preferred physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

I claim:

1. An apparatus for supervising and/or controlling the output power of an induction motor comprising:
   means for generating a first voltage signal (Ha) which varies with the actual speed of said motor in operation;
   means for generating a second voltage signal (S) corresponding to the synchronous speed of said motor;
   means for generating a third voltage signal (H) proportional to the speed of said motor at the rated maximum output;
   circuit means for generating voltage signals proportional to S−H or S−Ha;
   a first voltage divider circuit coupled to the output of said circuit means for changing the scale of said voltage proportional to S−Ha;
   a second voltage divider circuit coupled to the output of said first voltage signal generating means for producing an output voltage indicative of the actual speed of said motor in operation irrespective of the frequency of said voltage source; and
   indicator means responsive to said first and/or second voltage divider circuits.

2. An apparatus according to claim 1, wherein said indicator means comprises:
   a first meter responsive to said first voltage divider circuit for indicating the output power of said motor.

3. An apparatus according to claim 2, wherein said indicator means further comprises:
   a second meter responsive to said output voltage of said second voltage divider circuit.

4. An apparatus according to claim 3, further comprising:
   a differential amplifier provided in the input circuit of said second meter;
   circuit means providing a constant DC voltage to one of the inputs of said differential amplifier; and
   circuit means for making the gain from said differential amplifier variable.

5. An apparatus according to claim 3, further comprising:
   a differential amplifier provided in the input circuit of said second meter;
   circuit means providing a constant DC voltage to one of the inputs of said differential amplifier; and
   circuit means for making the sensitivity of said second meter variable.

6. An apparatus according to clam 4 or 5, further comprising:
   protective diode means connected in series with the output of said differential amplifier.

7. An apparatus according to claim 1, wherein said indicator means comprises:
   a meter selectively responsive to said first voltage divider circuit for indicating the output power of said motor or to said output voltage of said second voltage divider circuit for indicating the speed of said motor.

8. An apparatus according to claim 1, wherein said first and second voltage divider circuits are of the switching type and further comprising:
   switch controlling means for controlling the switching of said first voltage divider circuit with the voltage obtained from said second voltage divider circuit.

9. An apparatus according to claim 8, wherein said indicator means includes:
   a meter relay having a switching contact utilized as said switch controlling means.

10. An apparatus according to claim 8, wherein said switching controlling means includes:
    a third voltage divider circuit for dividing the output voltage of said second voltage divider circuit;
    zener diodes having different zener voltages connected to the dividing points of said third voltage divider circuit;
    transistors, the bases of which are connected to said zener diodes; and
    relays connected to the collectors of said transistors.

11. An apparatus according to claim 1, further comprising:
    diode means connected in parallel with said indicator means for the full scale protection thereof.

* * * * *